(12) United States Patent
Lu

(10) Patent No.: US 8,264,821 B2
(45) Date of Patent: Sep. 11, 2012

(54) REDUNDANT POWER SYSTEM TRANSFORMATION STRUCTURE

(75) Inventor: Shao-Feng Lu, Taoyuan Hsien (TW)

(73) Assignees: FSP Technology Inc., Taoyuan, Taoyuan Hsien (TW); 3Y Power Technology (Taiwan), Inc., Gueishan Shiang, Taoyuan Hsien (TW)

( * ) Notice: Subject to any disclaimer, the term of this patent is extended or adjusted under 35 U.S.C. 154(b) by 715 days.

(21) Appl. No.: 12/352,850

(22) Filed: Jan. 13, 2009

(65) Prior Publication Data

US 2010/0177465 A1 Jul. 15, 2010

(51) Int. Cl.
*H05K 5/00* (2006.01)
*H05K 7/00* (2006.01)
(52) U.S. Cl. ............... 361/679.01; 361/601; 361/679.6; 361/724; 361/725; 361/726; 361/727
(58) Field of Classification Search .............. 361/601, 361/679.01, 679.6, 724–727
See application file for complete search history.

(56) References Cited

U.S. PATENT DOCUMENTS

| 5,612,854 A | * | 3/1997 | Wiscombe et al. | 361/727 |
| 6,970,346 B2 | * | 11/2005 | Shih | 361/679.02 |
| 2004/0257762 A1 | * | 12/2004 | Shih | 361/687 |

FOREIGN PATENT DOCUMENTS

TW 562163 11/2003

* cited by examiner

*Primary Examiner* — Anthony Haughton
(74) *Attorney, Agent, or Firm* — Winston Hsu; Scott Margo

(57) ABSTRACT

A transformation structure for a redundant power system which includes at least two power supplies and a first circuit board to cluster the power supplies and deliver output thereof and a second circuit board electrically connected to the first circuit board. The second circuit board is coupled with at least one transformation module according to output potentials defined by users. The transformation module receives power from the second circuit board and regulates at least one output power. Hence, the present invention could be formed in an independent module with a function of power transformation. Thereby, the transformation module can be selected and mounted onto the second circuit board according to customer's requirements. The second circuit board has a sufficient area serving heat radiation and insulation. The present invention can obtains merits of decreasing the product size, enhancing heat radiation and providing changeable output specifications to meet customizing requirements.

16 Claims, 5 Drawing Sheets

REDUNDANT POWER SYSTEM TRANSFORMATION STRUCTURE

FIELD OF THE INVENTION

The present invention relates to a redundant power system transformation structure and particularly to a structure for a redundant power system to cluster a plurality of power supplies and integrate output.

BACKGROUND OF THE INVENTION

A conventional redundant power system usually consists of multiple sets of power supplies that share a common housing and a power integration back panel for control. In practice, it is called an N+M structure, where N is the number of power supplies to be clustered to meet total loading requirement of industrial computers, and M is the number of the power supplies allowed to be disabled. Taking 2+1 structure as an example, it consists of three sets of power supplies. The 1 at the rear means that one power supply may be disabled while other power supplies can still provide regular power needed. Depending on different requirements, an N+2 structure may also be adopted.

R.O.C. patent publication No. 562163 entitled "Redundant power supply" has a housing 10 and more than one track room 14 inside to house more than one power supply 30 connecting to a plurality of connectors 12 on a circuit board 11. The circuit board 11 integrates output power of the power supply 30 to form a redundant power.

The circuit board 11 previously discussed is the "back panel" commonly called in the redundant power supply. The main function of the back panel is to integrate the power of multiple power supplies and to also transform the power to supply output power at more than one different potential. With meeting the prevailing trend of demanding slim and light, the redundant power system also has to be made compact. Hence, the individual power supplies have to be made smaller, and the back panel also has to be shrunk. Such demands create problems in practice, notably:

First, to shrink the circuit board is difficult. As the back panel provides two basic functions of power integration and transformation, significant amount of power and current are converged on the back panel. Hence, a sufficient insulation capability has to be provided to meet safety regulations. Decreasing the size generally reduces the insulation capability. And voltage-resistance and insulation specifications of circuit elements also have to be enhanced. All this makes design more difficult and cost higher.

Second, heat radiation also is more difficult. Given the same amount of current and power integration and transformation, heat radiation on the smaller back panel is more difficult. Moreover, the dimensions of electronic elements for a greater current also are larger and cause the radiation space for airflow smaller. The smaller back panel has a higher power density in a unit area and a smaller area in contact with the air, and results in poorer heat radiant elements. As a result, malfunction probability increases.

Third, the power converged from all the power supplies are transformed to voltages of 12V, 5V or 3.3V or other potentials according to loading requirements. The conventional back panel has a transformed power and voltages set for the transformation circuit during design. Hence, alteration of the power and voltages is difficult to meet different loading requirements. This also limits the expandability of the redundant power system. For instance, even if the power supplies at the front end of the redundant power system are expandable, the back panel at the rear end has a fixed number of output lines and voltages, thus expandability is constrained.

SUMMARY OF THE INVENTION

In view of the problems occurred to the conventional redundant power system at a smaller size, the primary object of the present invention is to provide an output structure coupling with a plurality of power supplies to overcome the aforesaid problems.

The present invention provides a transformation structure for a redundant power system which includes at least two power supplies. The power supplies are installed in a housing and have respectively a first connection port to deliver output. The redundant power system also has a first circuit board to deliver output for multiple sets of the power supplies in a clustered fashion and a second circuit board electrically connected to the first circuit board. The second circuit board is connected to at least one transformation module according to output potentials defined by users. The second circuit board has at least one coupling zone to connect the transformation module. The transformation module receives power from the second circuit board and regulates the power to form at least one output power. The power transformation function in the redundant power system of the present invention is formed in an independent module. Thus the transformation module can be switched and mounted onto the coupling zone by producers according to customer's requirement of different output potentials. Moreover, the transformation module is a small independent circuit to allow the second circuit board to have a sufficient area to provide heat radiation and insulation functions. Such a design can reduce the size. Thus the present invention provides many benefits such as a smaller size, enhanced heat radiation and a greater flexibility for customization to alter output specifications.

The foregoing, as well as additional objects, features and advantages of the present invention will be more readily apparent from the following detailed description, which proceeds with reference to the accompanying drawings.

DETAILED DESCRIPTION OF THE PREFERRED EMBODIMENTS

Figure 1:
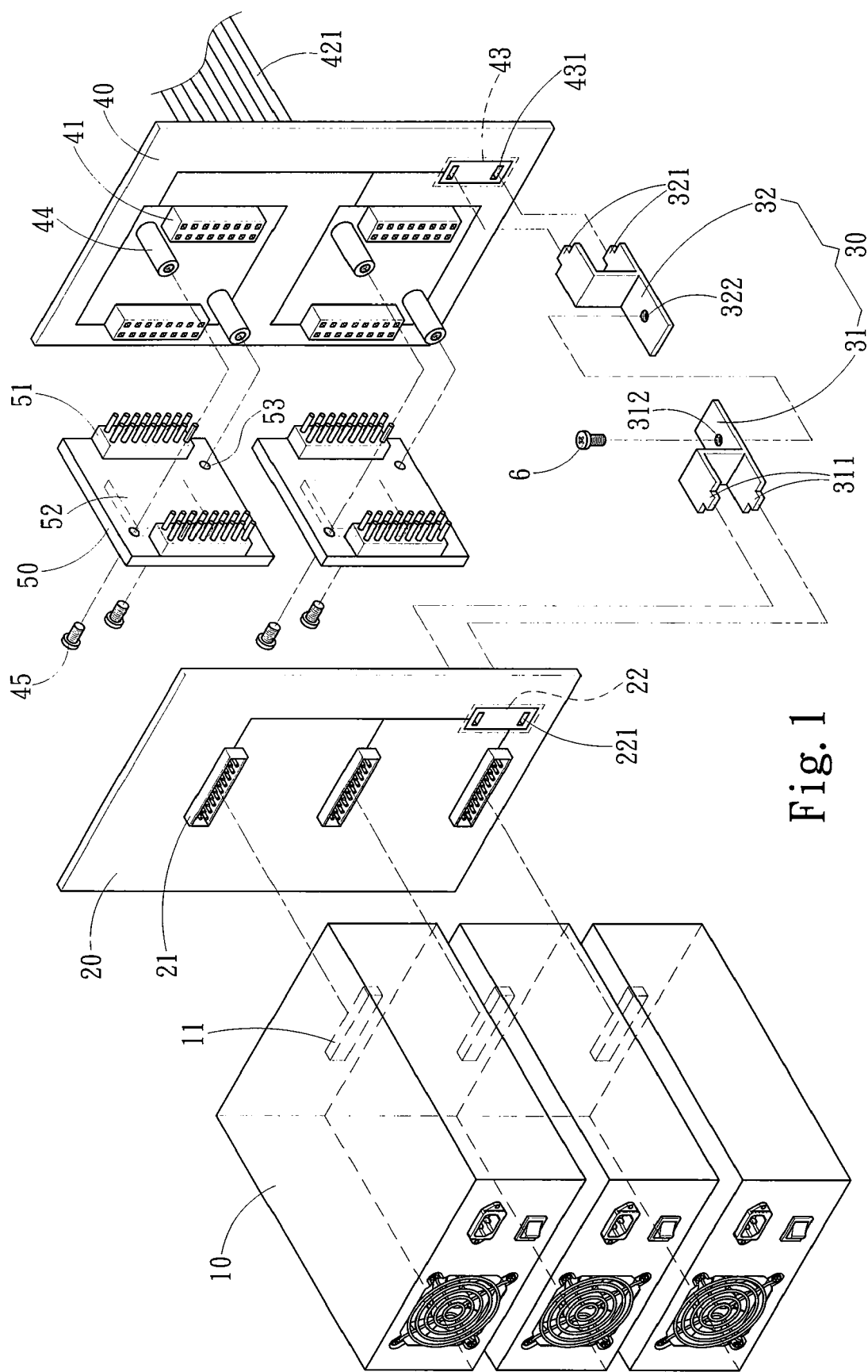
FIG. 1 is a schematic view of the present invention in a connecting condition.
Figure 2:
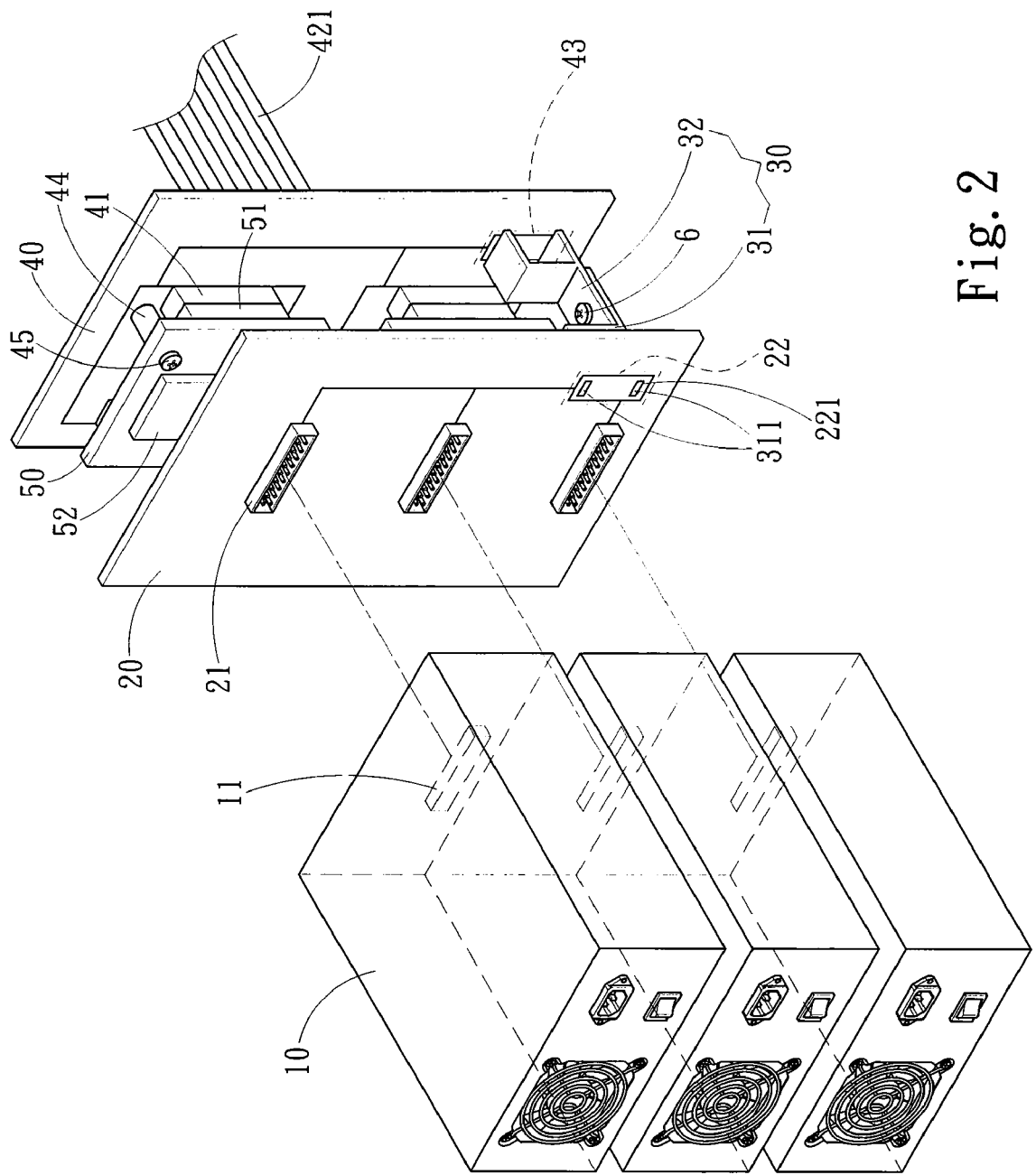
FIG. 2 is a schematic view of the present invention in another connecting condition.
Figure 3:
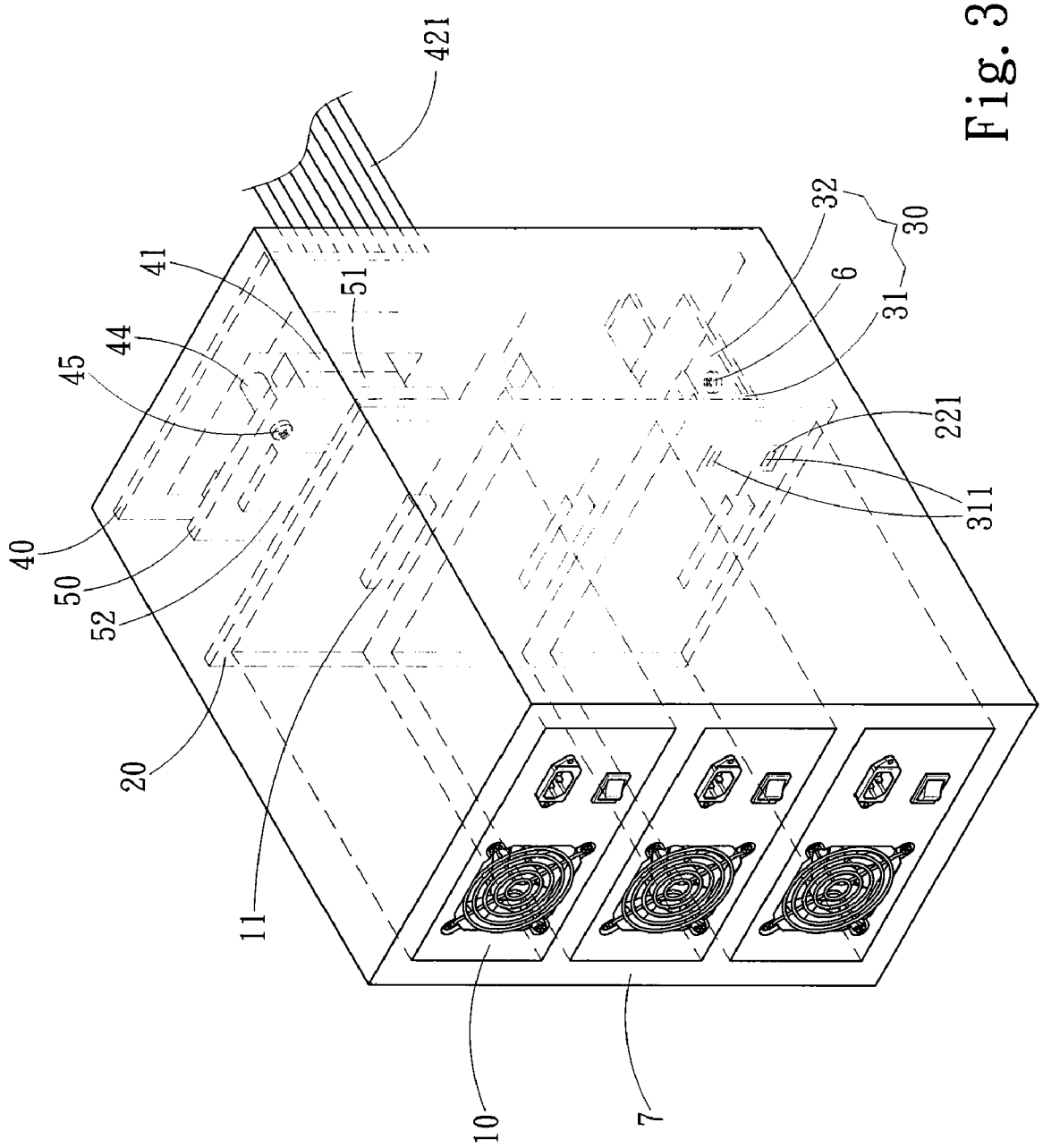
FIG. 3 is a schematic view of an embodiment of the present invention.

Please refer to FIG. 1 for an embodiment of the redundant power system transformation structure of the present invention. The redundant power system according to the present invention consists of at least two power supplies 10 installed in a housing 7 (also referring to FIGS. 3 and 4). Each of the power supplies 10 has a first connection port 11 to deliver output. The redundant power system further has a first circuit board 20 and a second circuit board 40. The first circuit board 20 has a plurality of second connection ports 21 corresponding and connecting electrically to the first connection port 11. The first circuit board 20 has a first anchor zone 22 connecting to at least one conductive element 30. And the second circuit board 40 has at least one second anchor zone 43 connecting to the conductive element 30. The anchor zones 22 and 43 have respectively an anchor hole 221 and 431 to be wedged in and connected by the conductive element 30. The connection may be a compact coupling or soldering. The second circuit board 40 receives combined power of the power supplies 10 through the electrically connected conductive element 30 and first circuit board 20. It also is connected to at least a transformation module 50 according to output potentials defined by users. The transformation module 50 has a transformation circuit 52. The second circuit board 40 sends the power from the conductive element 30 to the transformation module 50 which regulates the potential thereof to form at least one output power to be delivered. The second circuit board 40 has a plurality of power output portions 42 (also referring to FIGS. 4 and 5) which are electrically connected to the transformation module 50 and transport the output power from the transformation module 50 to drive a load (not shown in the drawings). The power output portions 42 may include a plurality of power cords 421 or output ports 422 (referring to FIGS. 4 and 5) that are configured independently or in a mixed manner according to requirements. Depending on customer's requirements of output voltage, a desired transformation module 50 can be selected and mounted onto the second circuit board 40. To facilitate power connection and transportation, the second circuit board 40 and the transformation module 50 have respectively an adapting port 41 and 51 corresponding and connecting to each other, as shown in FIG. 1, to receive and deliver the output power. The second circuit board 40 further has at least one anchor aiding portion 44. The transformation module 50 has an anchor aiding hole 53 corresponding to the anchor aiding portion 44 that are fastenable through a fastening element 45 so that the transformation module 50 can be fastened to the second circuit board 40. Hence, the second circuit board 40 can receive the output power generated by the transformation module 50 and deliver through the power output portions 42 to the load. To facilitate assembly and installation, the conductive element 30 may consist of one or more metal conductors 31 and 32 coupling together (referring to FIG. 1 in which two metal conductors 31 and 32 are provided). The metal conductors 31 and 32 have respectively a connection end 312 and 322 at the juncture with a corresponding screw hole formed thereon to be fastened together through a fastening element 6 to become the conductive element 30 connecting the first and second circuit boards 20 and 40. The conductive element 30 has at least two anchor ends 311 and 321 corresponding to connection spots of the first circuit board 20 and the second circuit board 40. The first circuit board 20 and the second circuit board 40 have respectively at least one anchor hole 221 and 431 on the anchor zones 22 and 43 to be electrically connected to the anchor ends 311 and 321. Thereby power can be transported between the first and second circuit boards 20 and 40 through the conductive element 30. In the embodiment previously discussed, the second circuit board 40 is located at one side of the first circuit board 20 in a parallel manner. The conductive element 30 bridges the first and second circuit boards 20 and 40 sideward. FIG. 2 illustrates a condition of the first and second circuit boards 20 and 40 connecting by the conductive element 30. Through the conductive element 30 power provided by all the power supplies 10 on the first circuit board 20 can be transported to the second circuit board 40. Through the transformation module 50 the power passing through the conductive element 30 is regulated, and through the power output portions 42 the output power is delivered to the load. In short, referring to an embodiment shown in FIG. 3, the housing 7 contains at least one power supply 10 inside. The first and second circuit boards 20 and 40 are electrically connected through the conductive element 30. The first circuit board 20 delivers the power provided from the power supply 10 to the second circuit board 40. The power is converged on the second circuit board 40 and regulated by the transformation module 50 to become the output power to be delivered through the power output portions 42. It is to be noted that the second circuit board 40 can be connected to one or more transformation module 50 to provide individual powers to the different power output portions 42. The power transformation module 50 also can generate the output power at the same voltage. Or different transformation modules 50 can be selected to output power at two or more different potentials according to customer's requirements. Hence the structure can provide the output power in various types. The first type is having at least one transformation module 50 on the second circuit board 40 with the power output portions 42 electrically connecting to the second circuit board 40 and the transformation module 50 so that output power is received through the conductive element 30 and delivered through the second circuit board 40, and transformed by the transformation module 50 to become output power of varying potentials. Namely, the second circuit board 40 receives the power from the conductive element 30 at a potential not yet be transformed and delivers directly to the power output portions 42. Meanwhile, the transformation module 50 on the second circuit board 40 also transforms the power and sends to the power output portions 42. The second type is having the second circuit board 40 to receive the power from the conductive element 30 and transform all the received power through the transformation module 50 and send to the power output portions 42 to deliver more than one output power. The transformation module 50 may include multiple sets to provide the output power at varying potentials. As a conclusion, the second circuit board 40 has at least one transformation module 50 to provide at least one transformed output power. It also can receive the power from the conductive element 30 and directly deliver the output power without transformation to meet requirements of varying output potentials.

Figure 4:
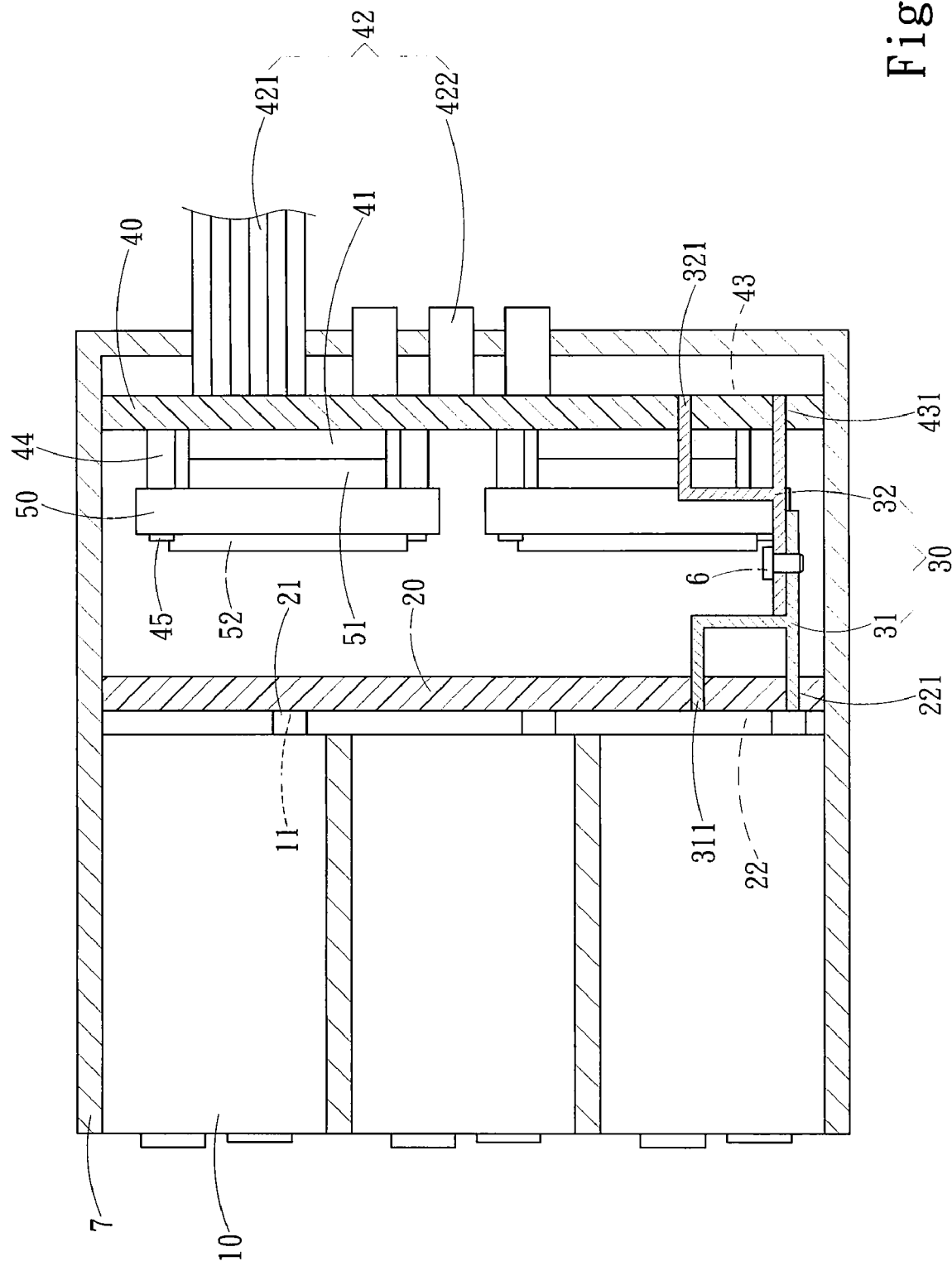
FIG. 4 is a sectional view of an embodiment of the present invention.
Figure 5:
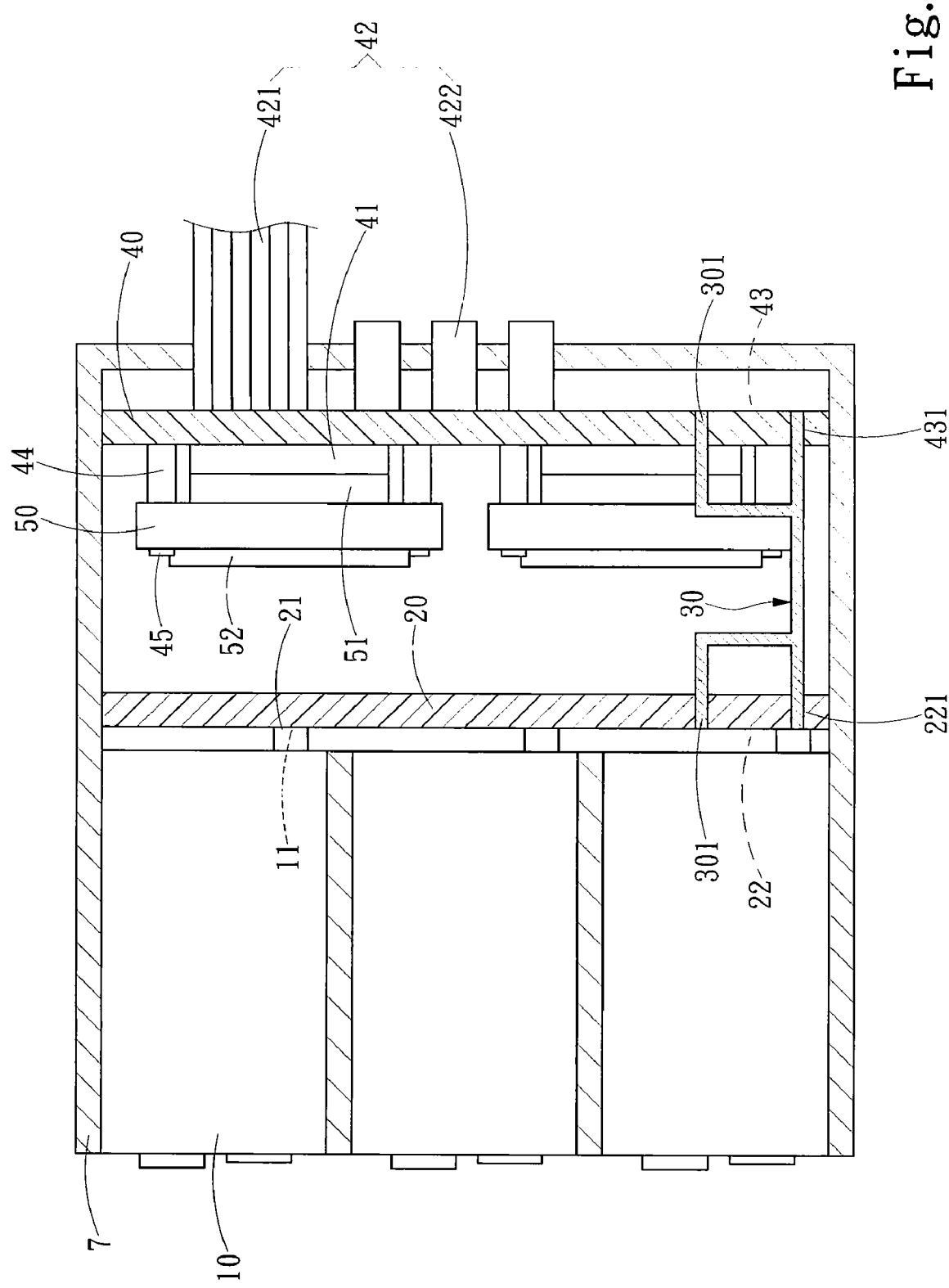
FIG. 5 is a sectional view of another embodiment of a conductive element of the present invention.

Referring to FIG. 4, the redundant power system is encased in the housing 7, and the power supply 10 is connected to the first circuit board 20. Through the conductive element 30 power is sent to the second circuit board 40 and regulated by the transformation module 50 and output. As previously discussed, the transformation module 50 can be switched and mounted onto the coupling zone of the second circuit board 40 to output different voltages according to customer's requirements. As the transformation module 50 is a smaller independent circuit, the second circuit board 40 can have a sufficient area to provide heat radiation and insulation functions. Thus total size can be shrunk, heat radiation effect improves and customization can be done easier to change output specifications as desired.

While the preferred embodiments of the present invention have been set forth for the purpose of disclosure, they are not the limitations of the present invention. For instance, in the drawings the metal conductors 31 and 32 are coupled through the screw hole and fastening element 6, but other coupling methods also can be adopted to achieve similar effect. The conductive element 30 may also be an integrated element with at least two anchor ends 301 (referring to FIG. 5). While the redundant power system is defined to include at least two power supplies 10 in the present invention previously discussed, the number of the power supplies 10 can be set by users as desired. For a power supply requirement of a smaller capacity, the redundant power system can be formed by a real power supply coupling with a virtual power supply. Such a technique is known in the art. Hence the power supply 10 of the present invention also can include at least one real power supply and at least one virtual power supply (the virtual power supply is formed in a profile same as the real power supply, hence FIGS. 1 through 5 also are applicable). Therefore modifications of the disclosed embodiments of the present invention as well as other embodiments thereof may occur to those skilled in the art. Accordingly, the appended claims are intended to cover all embodiments which do not depart from the spirit and scope of the present invention.

What is claimed is:

1. A transformation structure for a redundant power system which has at least two power supplies encased in a housing each having a first connection port, the redundant power system further comprising:
   a first circuit board which has a plurality of second connection ports corresponding and connecting electrically to the first connection ports, and at least one first anchor zone electrically connected to at least one conductive element to converge and deliver output of the power supplies; and
   a second circuit board which has at least one second anchor zone electrically connected to the conductive element and is connected to at least one transformation module according to output potentials defined by users to regulate the potential of power transported by the conductive element to form at least one output power to be delivered;
   wherein the conductive element is arbitrarily detachable from the first anchor zone, and is utilized for converging and delivering the output of the power supplies when the conductive element and the first anchor zone are assembled together; and the conductive element is arbitrarily detachable from the second anchor zone, and is utilized for delivering the output of the power supplies toward the second circuit board when the conductive element and the second anchor zone are assembled together; and
   wherein the at least one transformation module is arbitrarily detachable from the second circuit board, and is utilized for providing at least one output potential corresponding to the at least one transformation module when the at least one transformation module and the second circuit board are assembled together; and the second circuit board comprises a plurality of sets of adapting ports, allowing a number of the at least one transformation module to be greater than one to provide respective output potentials.

2. The transformation structure for a redundant power system of claim 1, wherein the conductive element has at least two anchor ends coupling with the first and second anchor zones of the first circuit board and the second circuit board.

3. The transformation structure for a redundant power system of claim 2, wherein the conductive element is formed by coupling at least one metal conductor which has a connection end corresponding and connecting to each other.

4. The transformation structure for a redundant power system of claim 2, wherein the conductive element is an integrated metal conductor.

5. The transformation structure for a redundant power system of claim 1, wherein the second circuit board is located at one side of the first circuit board in a parallel manner, and the conductive element bridges the second circuit board and the first circuit board at the one side thereof.

6. The transformation structure for a redundant power system of claim 1, wherein the transformation module has a transformation circuit and at least one first adapting port, the second circuit board having a second adapting port electrically connected to the first adapting port.

7. The transformation structure for a redundant power system of claim 1, wherein the second circuit board has at least one power output portion to deliver the output power to drive a load.

8. The transformation structure for a redundant power system of claim 7, wherein the power output portion is electrically connected to the transformation module and transports the output power from the transformation module.

9. The transformation structure for a redundant power system of claim 8, wherein the second circuit board is connected to a plurality of transformation modules which provide at least two different output potentials.

10. The transformation structure for a redundant power system of claim 7, wherein the power output portion is electrically connected to the second circuit board and the transformation module to transport the output power received from the conductive element and the output power at different potentials provided by the transformation module.

11. The transformation structure for a redundant power system of claim 10, wherein the second circuit board is connected to a plurality of transformation modules which provide at least two different output potentials.

12. The transformation structure for a redundant power system of claim 7, wherein the power output portion is a plurality of power cords.

13. The transformation structure for a redundant power system of claim 7, wherein the power output portion is a plurality of output ports.

14. The transformation structure for a redundant power system of claim 1, wherein the power supplies include at least one real power supply and at least one virtual power supply.

15. A transformation structure for a redundant power system which has at least two power supplies encased in a housing each having a first connection port, the redundant power system further comprising:
   at least one conductive element;
   a first circuit board which has a plurality of second connection ports corresponding and connecting electrically to the first connection ports, and at least one first anchor zone electrically connected to the at least one conductive element to converge and deliver output of the power supplies; and
   a second circuit board which has at least one second anchor zone electrically connected to the conductive element and is connected to at least one transformation module according to output potentials defined by users to regulate the potential of power transported by the conductive element to form at least one output power to be delivered;
   wherein the conductive element is arbitrarily detachable from the first anchor zone, and is utilized for converging and delivering the output of the power supplies when the conductive element and the first anchor zone are assembled together; and the conductive element is arbitrarily detachable from the second anchor zone, and is utilized for delivering the output of the power supplies toward the second circuit board when the conductive element and the second anchor zone are assembled together; and
   wherein the at least one transformation module is arbitrarily detachable from the second circuit board, and is utilized for providing at least one output potential corresponding to the at least one transformation module when the at least one transformation module and the second circuit board are assembled together; and the second circuit board comprises a plurality of sets of adapting ports, allowing a number of the at least one transformation module to be greater than one to provide respective output potentials.

16. A transformation structure for a redundant power system which has at least two power supplies encased in a housing each having a first connection port, the redundant power system further comprising:
   at least one conductive element;
   a first circuit board which has a plurality of second connection ports corresponding and connecting electrically to the first connection ports, and at least one first anchor zone electrically connected to at least one conductive element to converge and deliver output of the power supplies; and
   a second circuit board which has at least one second anchor zone electrically connected to the conductive element and is connected to at least one transformation module according to output potentials defined by users to regulate the potential of power transported by the conductive element to form at least one output power to be delivered;
   wherein the at least one transformation module is arbitrarily detachable from the second circuit board, and is utilized for providing at least one output potential corresponding to the at least one transformation module when the at least one transformation module and the second circuit board are assembled together; and the second circuit board comprises a plurality of sets of adapting ports, allowing a number of the at least one transformation module to be greater than one to provide respective output potentials.

* * * * *